(12) United States Patent
Neal et al.

(10) Patent No.: US 8,932,087 B2
(45) Date of Patent: Jan. 13, 2015

(54) HOT LINE STIRRUP CONNECTOR

(71) Applicant: Thomas & Betts International, Inc., Wilmington, DE (US)

(72) Inventors: Alan D. Neal, Germantown, TN (US); Mark R. Drane, Germantown, TN (US); Cong T. Dinh, Collierville, TN (US); Matthew D. Cawood, De Leon Springs, FL (US); Ronald Vallette, Ormond Beach, FL (US); James Zahnen, Ormond Beach, FL (US)

(73) Assignee: Thomas & Betts International, Inc., Wilmington, DE (US)

( * ) Notice: Subject to any disclaimer, the term of this patent is extended or adjusted under 35 U.S.C. 154(b) by 22 days.

(21) Appl. No.: 13/773,900

(22) Filed: Feb. 22, 2013

(65) Prior Publication Data

US 2013/0303035 A1 Nov. 14, 2013

Related U.S. Application Data

(60) Provisional application No. 61/644,130, filed on May 8, 2012.

(51) Int. Cl.
*H01R 11/14* (2006.01)

(52) U.S. Cl.
CPC ..................................... *H01R 11/14* (2013.01)
USPC ........................................................ 439/776

(58) Field of Classification Search
USPC .................... 439/776, 781, 803, 783; 174/650
See application file for complete search history.

(56) References Cited

U.S. PATENT DOCUMENTS

| | | | |
|---|---|---|---|
| 2,107,061 A | 2/1938 | Pittman et al. | |
| 2,151,524 A | 3/1939 | Pittman et al. | |
| 2,253,432 A * | 8/1941 | Johnson | 439/803 |
| 2,304,807 A * | 12/1942 | Donoghue | 439/803 |
| 2,453,761 A | 11/1948 | Schoonmaker | |
| 2,506,010 A * | 5/1950 | Birkenmaier | 439/803 |
| 2,508,778 A | 5/1950 | Spears | |
| 2,530,299 A | 11/1950 | Hendley | |
| 2,811,703 A | 10/1957 | Becker | |
| 2,864,071 A | 12/1958 | Johnson, Jr. | |
| 2,867,787 A | 1/1959 | Nilsson | |
| 2,958,067 A | 10/1960 | Hardy | |
| 2,986,053 A | 5/1961 | Atman et al. | |
| 3,036,286 A | 5/1962 | Gorc et al. | |
| 3,075,166 A | 1/1963 | Peek | |
| 3,097,037 A | 7/1963 | Gainer et al. | |
| 3,115,540 A * | 12/1963 | Greer | 174/71 R |
| 3,142,525 A | 7/1964 | Roosman | |
| 3,275,974 A * | 9/1966 | Mixon, Jr. | 439/783 |
| 3,544,956 A | 12/1970 | Bricker, Jr. | |

(Continued)

*Primary Examiner* — Alexander Gilman
(74) *Attorney, Agent, or Firm* — Snyder, Clark, Lesch & Chung, LLP

(57) ABSTRACT

A stirrup connector includes a cable connecting device, a clamp, and a control section. The cable connecting device is configured to secure a tap line to the stirrup connector. The clamp secures the stirrup connector to a stirrup. The clamp includes a set of jaws forming an opening that is smaller than a diameter of the stirrup and is configured to snap onto the stirrup when the set of jaws is forced against the stirrup at the opening. The control section is configured to be releasably engaged with a hot stick and to translate a connecting force from the hotstick to the clamp to secure the clamp to the stirrup. The stirrup connector provides an electrical connection between the stirrup and the tap line when the clamp is secured to the stirrup.

20 Claims, 12 Drawing Sheets

(56) References Cited

U.S. PATENT DOCUMENTS

| | | |
|---|---|---|
| 4,097,108 A | 6/1978 | Prodel |
| 4,600,264 A * | 7/1986 | Counsel .................. 439/783 |
| 4,846,725 A | 7/1989 | Williams et al. |
| 4,911,572 A | 3/1990 | Williams |
| 4,934,949 A | 6/1990 | Charneski et al. |
| D329,224 S | 9/1992 | Dinkel |
| 5,240,441 A * | 8/1993 | Laricchia et al. .............. 439/783 |
| 5,358,423 A * | 10/1994 | Burkhard et al. .............. 439/402 |
| 5,556,299 A * | 9/1996 | Finke .............................. 439/479 |
| 5,704,816 A * | 1/1998 | Polidori ........................ 439/781 |
| 6,043,433 A | 3/2000 | Schweitzer, Jr. |
| 7,160,142 B2 | 1/2007 | Hughes et al. |
| 2005/0155783 A1* | 7/2005 | Da Silva .................... 174/65 R |
| 2013/0303035 A1* | 11/2013 | Neal et al. ...................... 439/776 |

\* cited by examiner

US 8,932,087 B2

HOT LINE STIRRUP CONNECTOR

RELATED APPLICATION

This application claims priority under 35 U.S.C. §119, based on U.S. Provisional Patent Application No. 61/644,130, filed May 8, 2012, the disclosure of which is hereby incorporated by reference herein.

BACKGROUND INFORMATION

Electrical stirrups may be employed to connect tap lines from live (or "hot") high voltage electrical transmission lines to other devices, such as a transformer. The use of such stirrups avoids making a connection directly to the transmission line and, thus, prevents damage to the transmission line as the result of arcing between the transmission line and the tap line extending from the other device. Stirrups may be connected to a transmission line by a crimped connection, by bolting, by spring clips, etc. Tap lines may be connected to the stirrup using a stirrup connector.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

In implementations described herein, a stirrup connector may be configured to snap onto a stirrup attached to a power line. The stirrup connector may include a clamp, sized for the particular stirrup, that can be attached to the stirrup using a hot stick. In some implementations, the stirrup connector provides a storm-safe configuration that separates from the stirrup if, for example, a tree limb falls onto the tap line associated with the stirrup.

Figure 1:
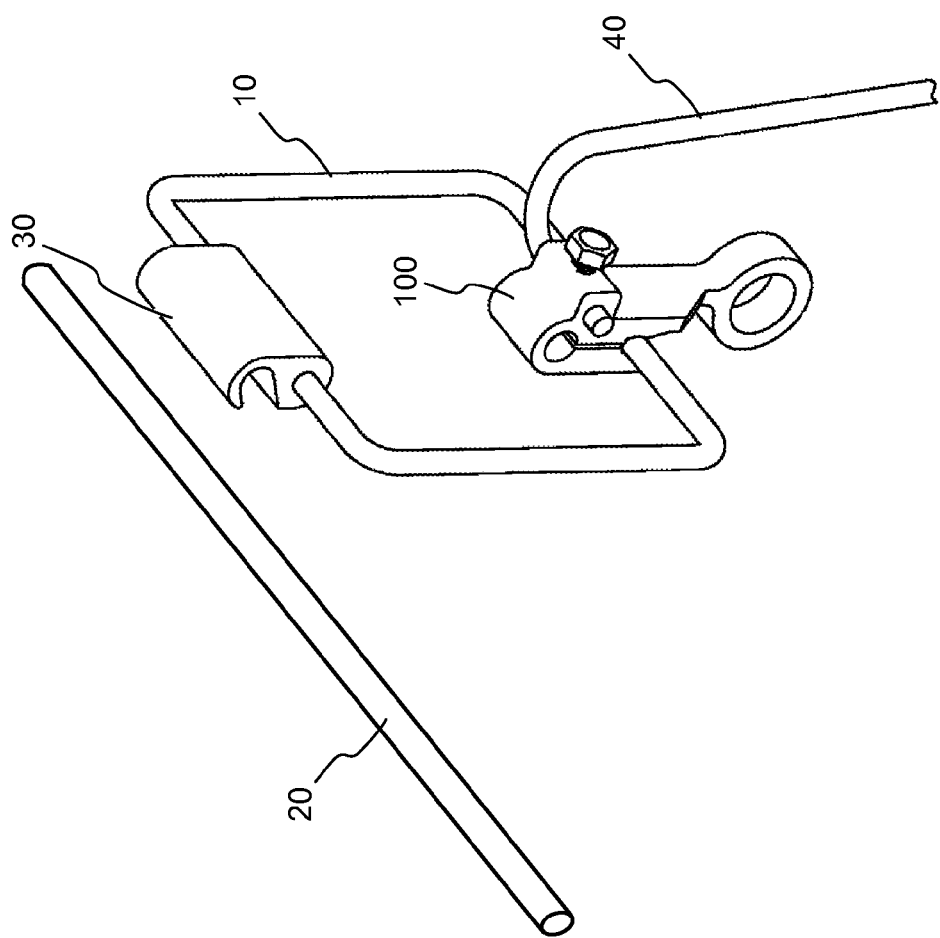
FIG. 1 provides an isometric view of a stirrup connector system according to an implementation described herein.

FIG. 1 provides an isometric view of a stirrup connector system according to an implementation described herein. A stirrup 10 may be connected to a power line 20 by a power line connector 30. Stirrup 10 may include a wire or rod attached to power line connector 30 so as to form a loop. Stirrup 10 and power line 30 may both be formed from electrically conductive materials. Power line connector 30 may be secured to power line 20 such that voltage from power line 20 passes through power line connector 30 and stirrup 10. Power line connector 30 may include, for example, a crimp-type connector, a bolted connector, a spring connector, etc. A tap line 40 may be a joined to stirrup 10 by a stirrup connector 100.

Figure 2:
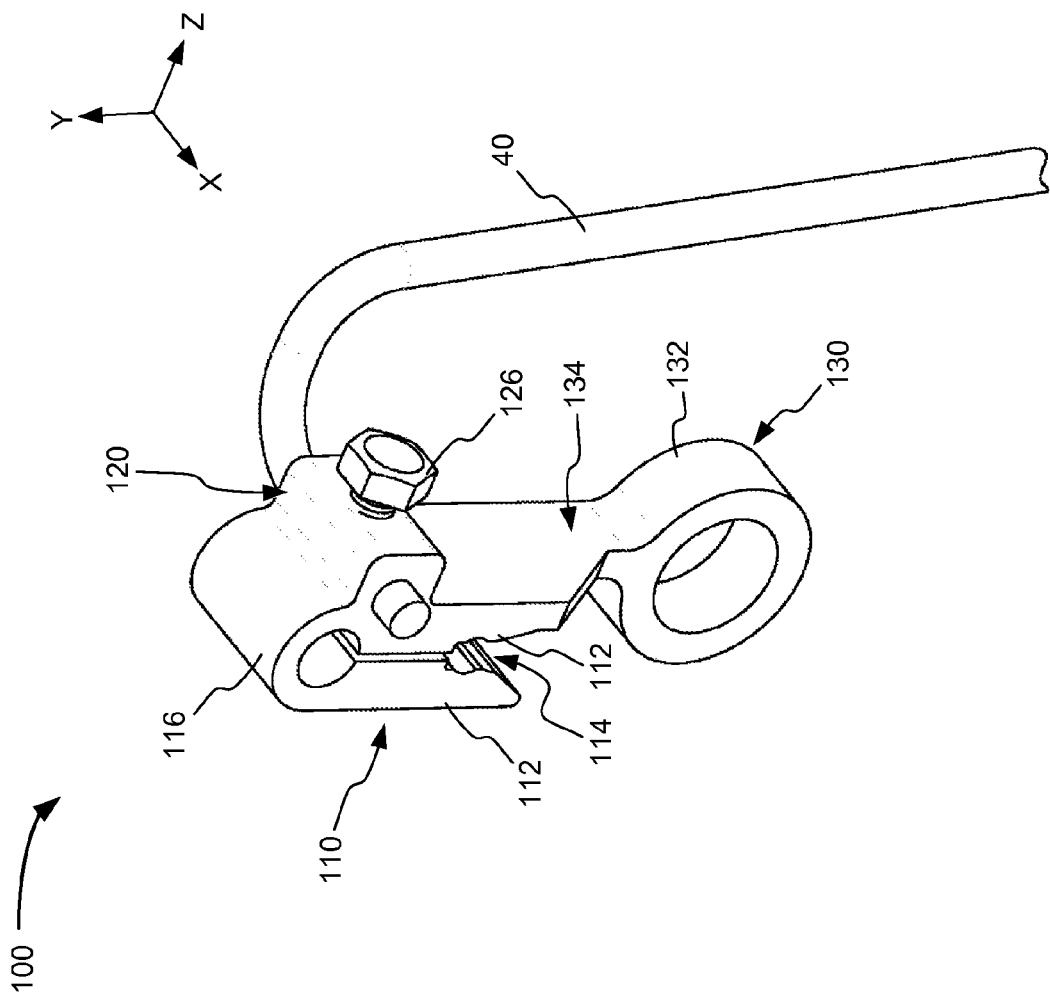
FIG. 2 provides an isometric view of the stirrup connector of FIG. 1.
Figure 3:
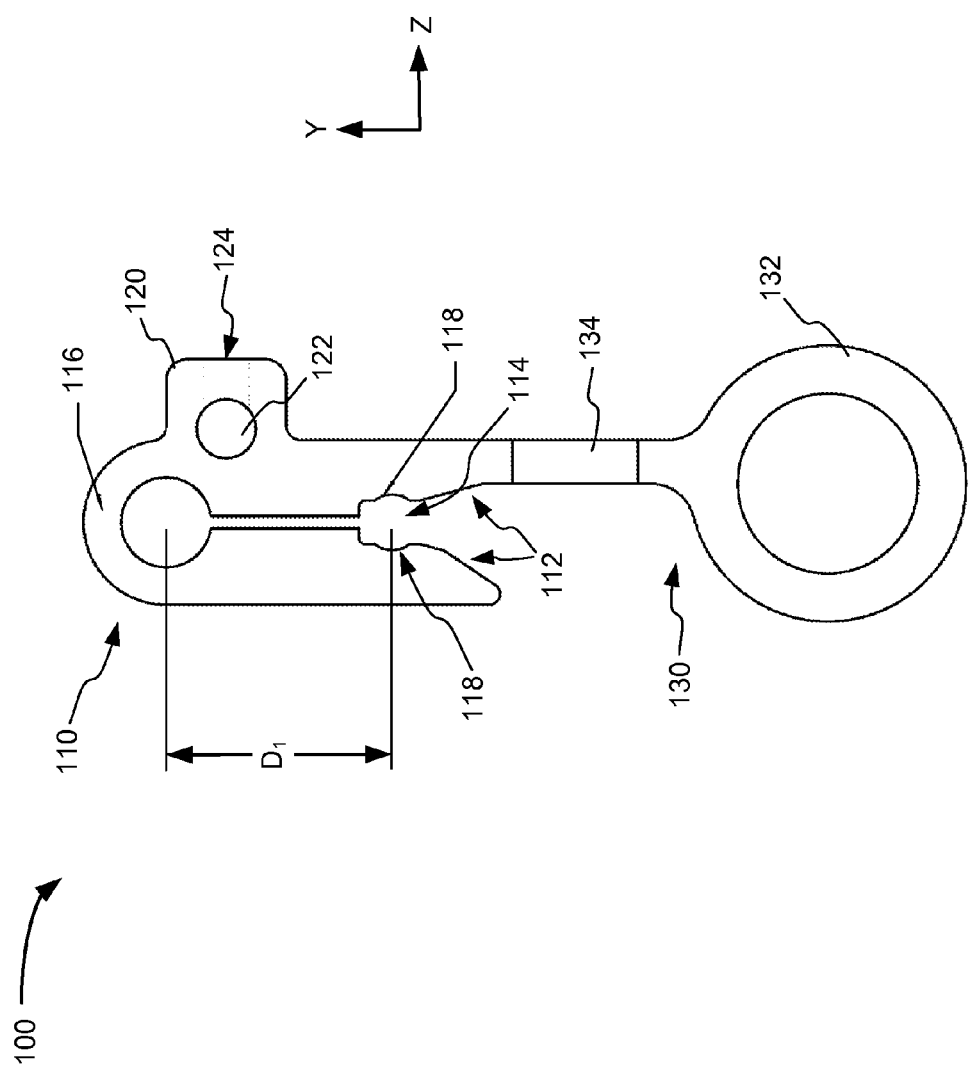
FIG. 3 provides a side view of the stirrup connector of FIG. 1.

FIG. 2 provides an isometric view of stirrup connector 100 with tap line 40 connected thereto, and FIG. 3 provides a side view of stirrup connector 100. Referring collectively to FIGS. 1-3, stirrup connector 100 may include a clamp 110, a lug area 120, and a control section 130. Clamp 110 may include a pair of jaws 112 that form a clamping area 114. Clamping area 114 may be configured to secure stirrup 10 within stirrup connector 100 and provide for electrical conductivity between stirrup 10 and jaws 112. Clamping area 114 may generally be sized to receive a particularly type of stirrup (e.g., a stirrup with a wire/rod of a certain diameter or range of diameters).

Clamping area 114 may include different shapes to ensure consistent contact between stirrup 10 and jaws 112. In one implementation, as shown in FIGS. 1-3, clamping area 114 may be formed from curved portions 118 of jaws 112 with each curved portion having an arc with a radius generally equal to the radius of the stirrup 10 wire. In another implementation, clamping area 114 may include a different configuration to provide, for example, a line/edge contact between jaws 112 and stirrup 10.

As shown in FIGS. 1-3, jaws 112 may be joined at one end of stirrup connector 100 by a flexing area 116. Flexing area 116 may generally allow for expansion of jaws 112 to receive stirrup 10 within clamping area 114. The width (e.g., along the X-axis shown in FIG. 2) and thickness (e.g., along the Y-axis shown in FIG. 2) of flexing area 116 may be determined for a given application based on, for example, the type of material and cross-sectional area requirements for conductivity. A distance, $D_1$, between flexing area 116 and clamping area 114 may be selected to provide a required flexing/clamping force.

Lug area 120 may include a channel 122 and a threaded bore 124. Channel 122 may be configured to receive tap line 40. The diameter of channel 122 may be, for example, slightly larger than the diameter of tap line 40. In another implementation, the diameter of channel 122 may be sufficiently large to accommodate a range of tap lines with smaller diameters than channel 122. Threaded bore 124 may be configured to receive a set screw 126. As shown in FIG. 1, set screw 126 may be inserted through threaded bore 124 to contact tap line 40 and secure tap line 40 within channel 122. In other implementations, lug area 120 may include another type of device (e.g., a clamp, an anchor, a clip, etc.) to secure tap line 40 to stirrup connector 100.

Control section 130 may include a hot stick ring 132 configured to receive a hot stick. The hot stick may include a non-conductive rod or pole with one of a variety of end attachments, such as a hook or clamp. Hot stick ring 132 may be sized to receive one or more standard hot stick attachments to enable stirrup connector 100 to be placed on stirrup 10. In one implementation, shown in FIGS. 1-3, control section 130 may include a transition region 134 to transition between different widths (e.g., widths along the X-axis shown in FIG. 2) of clamp 110/lug area 120 and hot stick ring 132. Different widths of clamp 110/lug area 120 and hot stick ring 132 may be necessary due to different governing design constraints. For example, the width of clamp 110/lug area 120 may be sized to provide a particular cross-sectional area required for conductivity between stirrup 10 and tap line 40, whereas the width of hot stick ring 132 may be sized based on dimensions of standard hot stick attachments.

Control section 130 may translate applied force from a hotstick to other portions of stirrup connector 100. For example, when stirrup 10 is positioned between jaws 112 of stirrup connector 100 a downward force applied to hotstick ring 132 may be translated to clamp 110 to force jaws 112 over stirrup 10.

Figure 4:
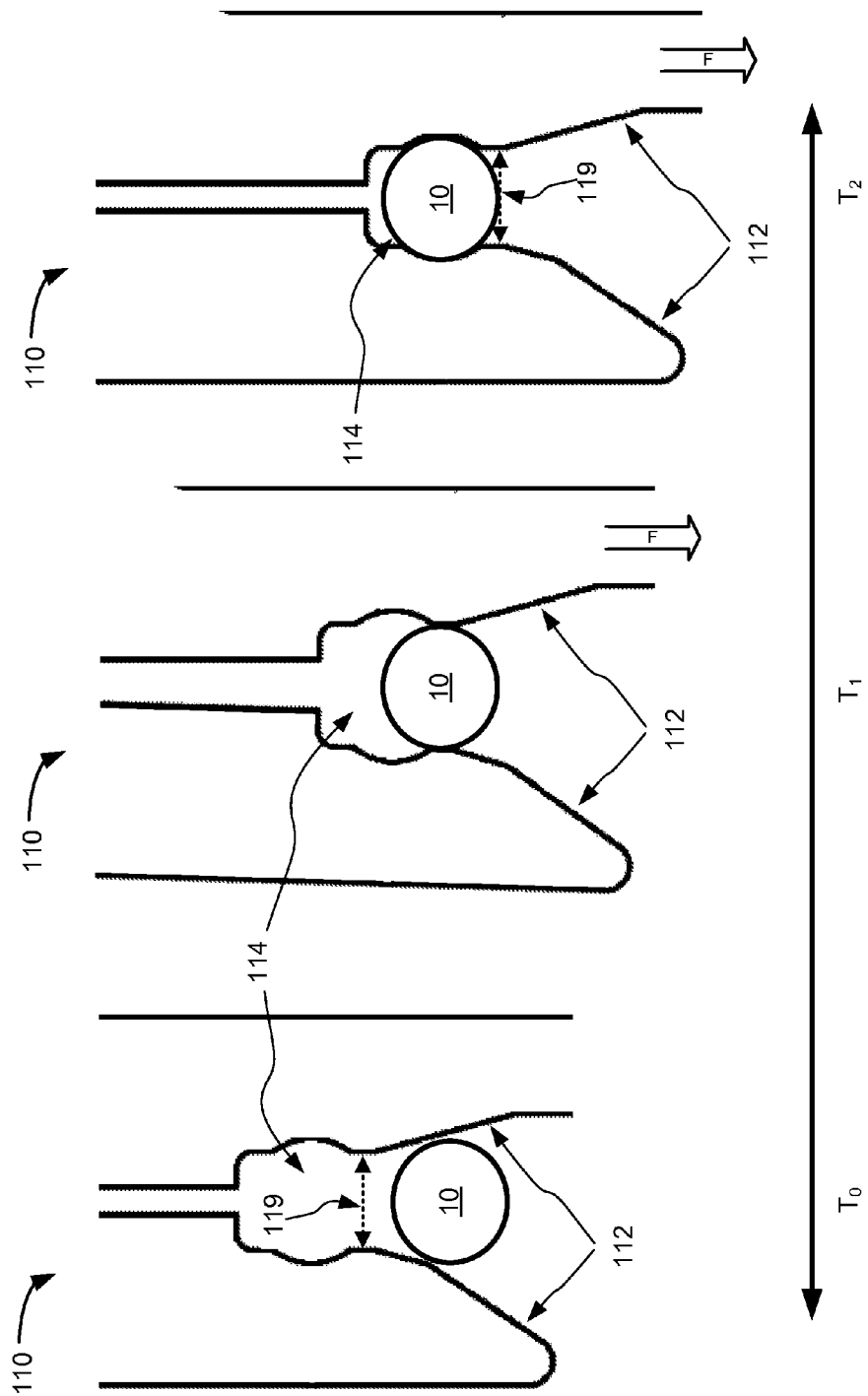
FIG. 4 provides a side view of a staged progression showing attachment of a portion of the stirrup connector of FIG. 1 to a stirrup.

FIG. 4 provides a side view of a staged progression showing attachment of a portion of stirrup connector 100 to stirrup 10. As shown in FIG. 4, at a time $T_0$, jaws 112 of stirrup connector 100 may be in a rest position. At time $T_1$, a force, F, is applied (e.g., by a hotstick applying a downward force to hotstick ring 132) in the direction shown. Stirrup connector 100 engages stirrup 10 and jaws 112 may expand to accommodate the diameter of stirrup 10 past an entry point 119 of clamping area 114 as stirrup connector 100 is pulled downward over stirrup 10. At time $T_2$, force, F, pulls entry point 119 of jaws 112 past stirrup 10, and flexing area 116 may cause subsequent contraction of jaws 112 (e.g., after stirrup 10 passes entry point 119) to secure stirrup 10 within clamping area 114. Thus, the profile of jaws 112 allows clamp 110 to snap onto stirrup 10 when stirrup connector 100 is pulled downwardly over stirrup 10.

Generally, channel 122 may be positioned in a different vertical and/or horizontal plane than clamping area 114 to allow a force on tap line 40 to impart a rotational force to stirrup connector 100. Stirrup connector 100 may pivot around stirrup 10 so that the connecting force to secure clamp 110 to stirrup 10 and a disconnecting force to release clamp 110 from stirrup 10 can be applied in generally the same direction (e.g., relative to a stationary surface, such as the ground).

Figure 5:
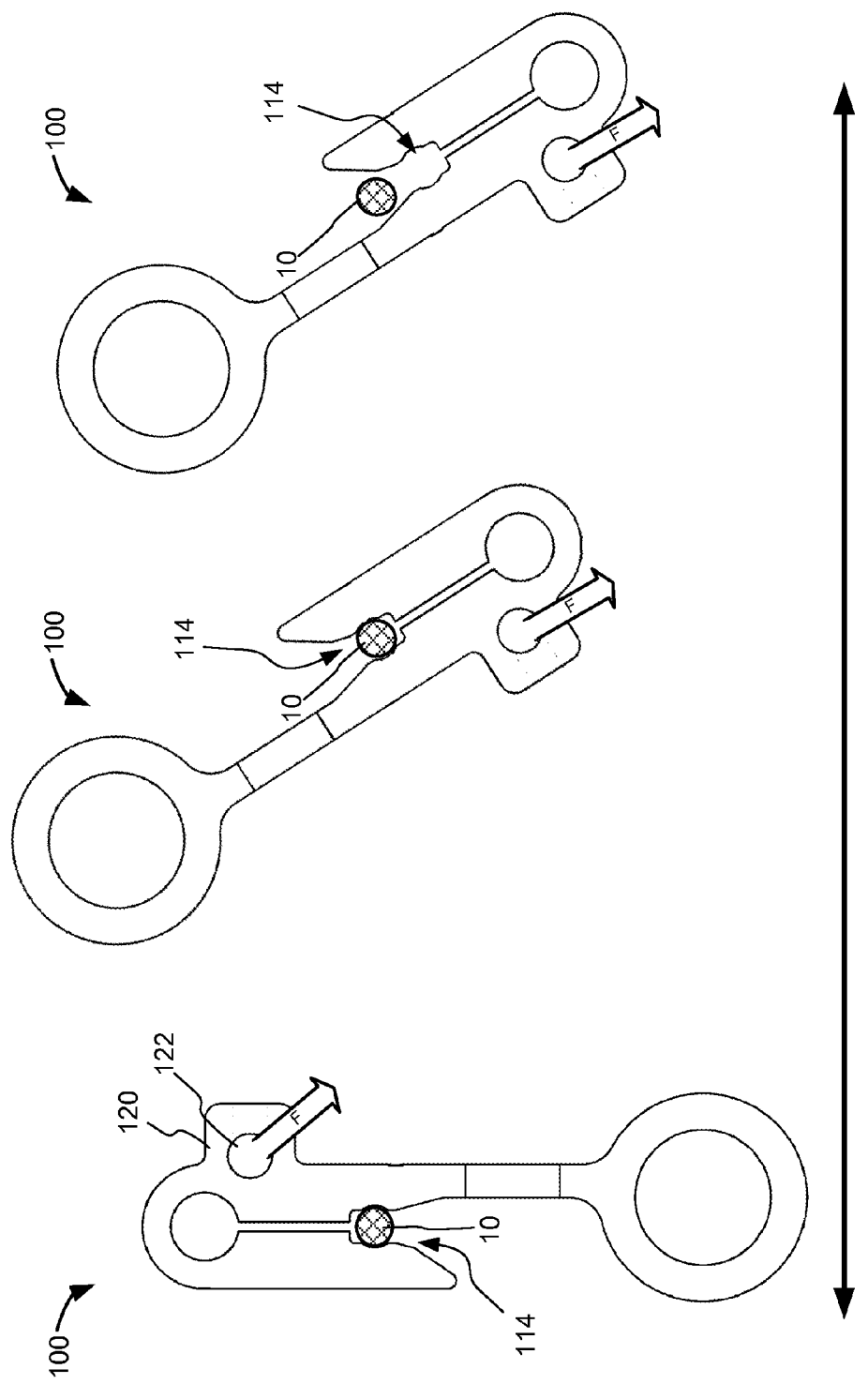
FIG. 5 provides an example of rotational movement of the stirrup connector of FIG. 1.

FIG. 5 provides an example of rotational movement of stirrup connector 100. Assume at a time $T_3$, an object (e.g., a tree limb) falls on tap line 40 (not shown), tap line 40 may exert a force, F, in a direction shown in FIG. 5 (e.g., generally corresponding to the axial direction of tap line 40). In the implementation of FIGS. 1-5, channel 122 of lug area 120 is positioned in a different vertical plane (e.g., a plane orthogonal to the Z-axis of FIG. 2) and a different horizontal plane (e.g., a plane orthogonal to the Y-axis of FIG. 2) than that of clamping area 114. As shown in FIG. 5 at time $T_4$, the force, F, may cause stirrup connector 100 to pivot (or rotate) around stirrup 10. Assuming the force, F, is sufficient to overcome the clamping force of clamp 110, clamp 110 may disengage from stirrup 10, at shown in FIG. 5 at time $T_5$. Thus, a damaging force on tap line 40 will cause stirrup connector 100 to break away from stirrup 10 and prevent additional damage to power line 20.

Figure 6:
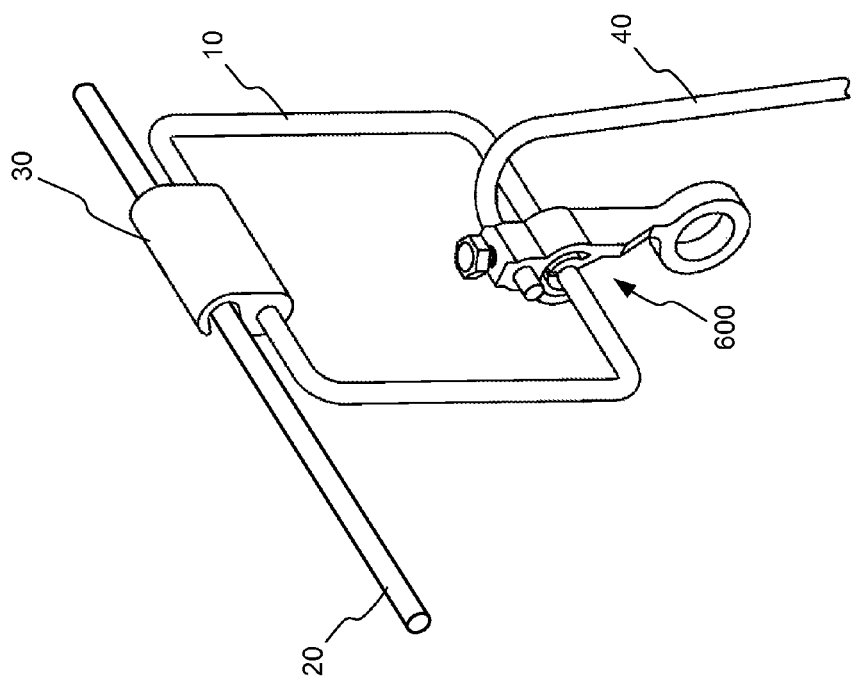
FIG. 6 provides an isometric view of another stirrup connector system according to an implementation described herein.

FIG. 6 provides an isometric view of a stirrup connector system according to another implementation described herein. Similar to FIG. 1, stirrup 10 may be connected to power line 20 by a power line connector 30. In the implementation of FIG. 6, a tap line 40 may be a joined to stirrup 10 by a stirrup connector 600.

Figure 7:
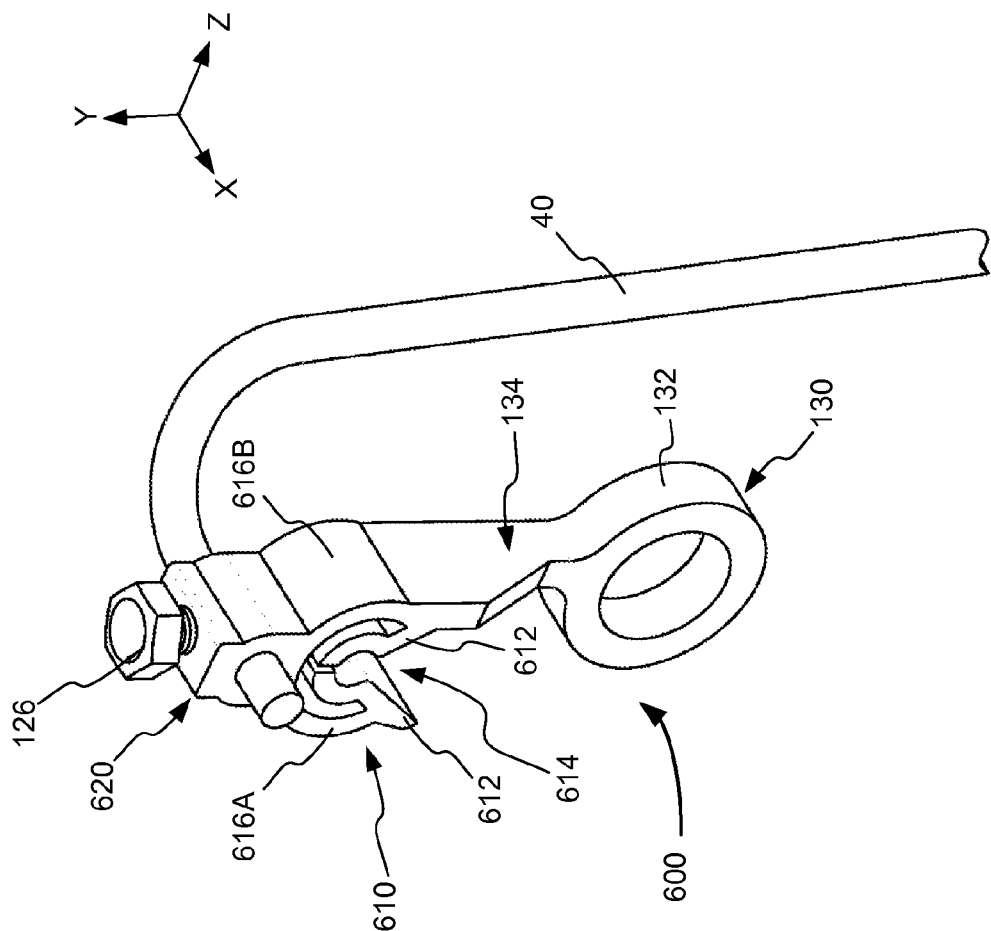
FIG. 7 provides an isometric view of the stirrup connector of FIG. 6.
Figure 8:
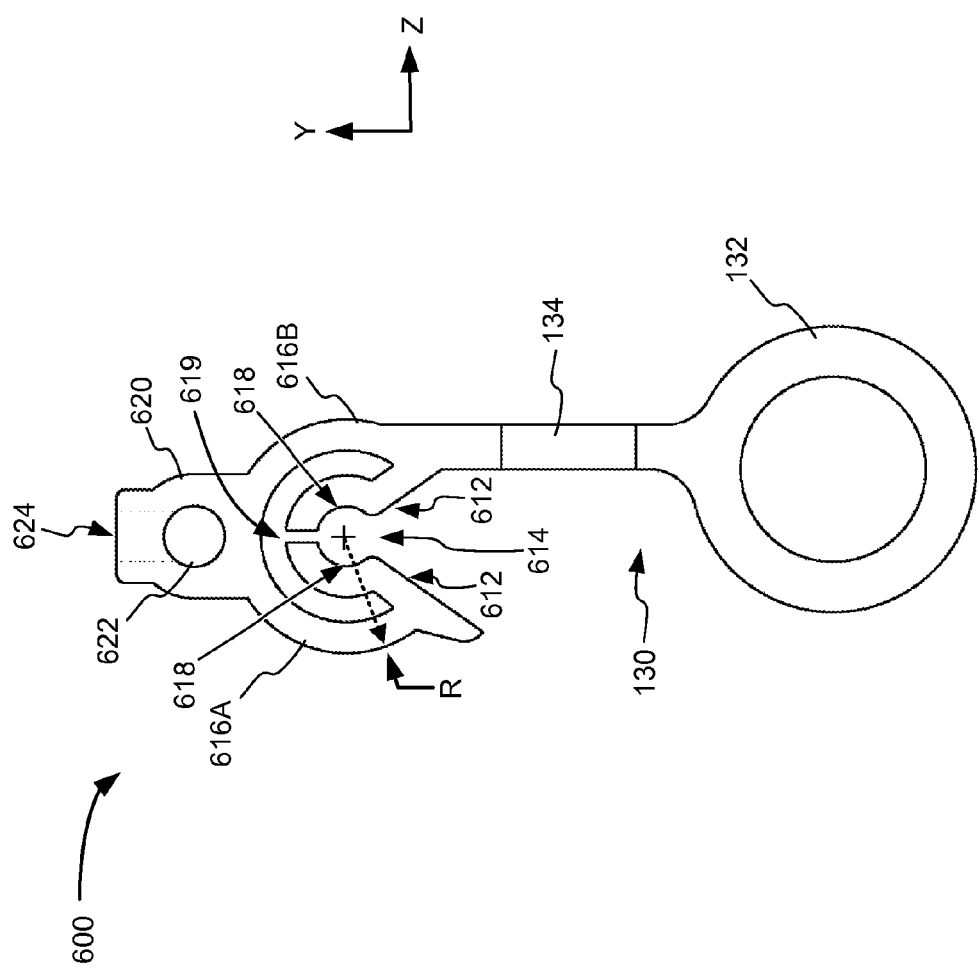
FIG. 8 provides a side view of the stirrup connector of FIG. 6.

FIG. 7 provides an isometric view of stirrup connector 600 with tap line 40 connected, and FIG. 8 provides a side view of stirrup connector 600. Referring collectively to FIGS. 6-8, stirrup connector 600 may include a clamp 610, a lug area 620, and control section 130. Clamp 610 may include a pair of jaws 612 that form a clamping area 614. Clamping area 614 may be configured to secure stirrup 10 and provide for electrical conductivity between stirrup 10 and jaws 612. Clamping area 614 may generally be sized to receive a particularly type of stirrup (e.g., a stirrup with a wire/rod of a certain diameter or range of diameters).

Clamping area 614 may include different shapes to ensure consistent contact between stirrup 10 and jaws 612. In one implementation, as shown in FIGS. 6-8, clamping area 614 may be formed from curved portions 618 of jaws 612 with each curved portion having an arc with a radius generally equal to the radius of the stirrup 10 wire. In another implementation, clamping area 614 may include a different configuration to provide, for example, a line/edge contact between jaws 612 and stirrup 10.

As shown in FIGS. 6-8, jaws 612 may be joined to lug area 620 at one end of stirrup connector 600 by a set of flexing areas 616A and 616B (referred to herein collectively as "flexing areas 616"). Flexing areas 616 may generally allow for expansion of jaws 612 to receive stirrup 10 within clamping area 614. Curved portions 618 may be separated by a small gap 619 to permit independent flexing between flexing areas 616. The width (e.g., along the X-axis shown in FIG. 7) and thickness of flexing areas 616 may be determined for a given application based on, for example, the type of material, the required clamping force, and cross-sectional area requirements for conductivity. A radius, R, along a portion of each flexing area 616A and 616B may be selected to provide a desired flexing/clamping force.

Similar to lug area 120 of FIGS. 1-5B, lug area 620 may include a channel 622 and a threaded bore 624. Channel 622 may be configured to receive tap line 40. Threaded bore 624 may be configured to receive a set screw 626. Set screw 626 may be inserted through threaded bore 624 to contact tap line 40 and secure tap line 40 within channel 622. Lug area 620 may be located on a top portion of stirrup connector 600

Control section 130 may include features described above in connection with FIGS. 1-5. Similar to descriptions above in connection with, for example, FIG. 4, an opening at jaws 612 may generally expand and contract to enable clamp 610 to snap onto stirrup 10 when stirrup connector 600 is pulled downward over stirrup 10.

Lug area 620 generally, and channel 622 particularly, may be positioned in a different horizontal plane (e.g., a plane orthogonal to the Y-axis of FIG. 7) than clamping area 614 to allow a force on tap line 40 to impart a rotational force to stirrup connector 600. In another implementation, channel 622 may be located on a both a different vertical and horizontal plane from clamping area 614. Similar to the description above in connection with, for example, FIG. 5, the location of channel 622 in a different plane than clamping area 614 may also cause rotational motion of stirrup connector 600 to permit stirrup connector 600 to disengage from stirrup 10 if excessive force is applied to tap line 40.

Figure 9:
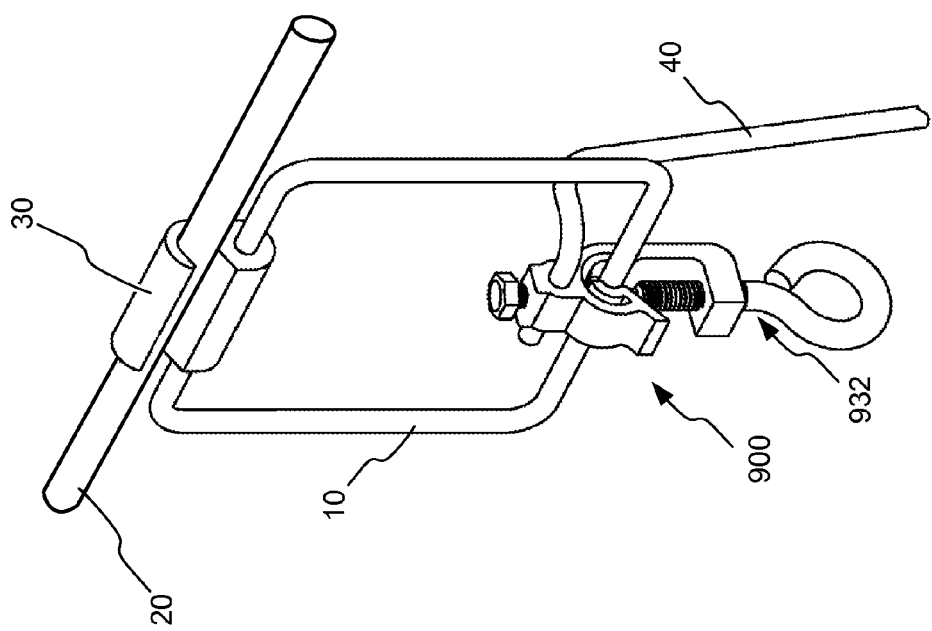
FIG. 9 provides an isometric view of still another stirrup connector system according to an implementation described herein.

FIG. 9 provides an isometric view of a stirrup connector system according to another implementation described herein. Similar to FIGS. 1 and 6, stirrup 10 may be connected to power line 20 by a power line connector 30. In the implementation of FIG. 9, a tap line 40 may be a joined to stirrup 10 by a stirrup connector 900.

Figure 10:
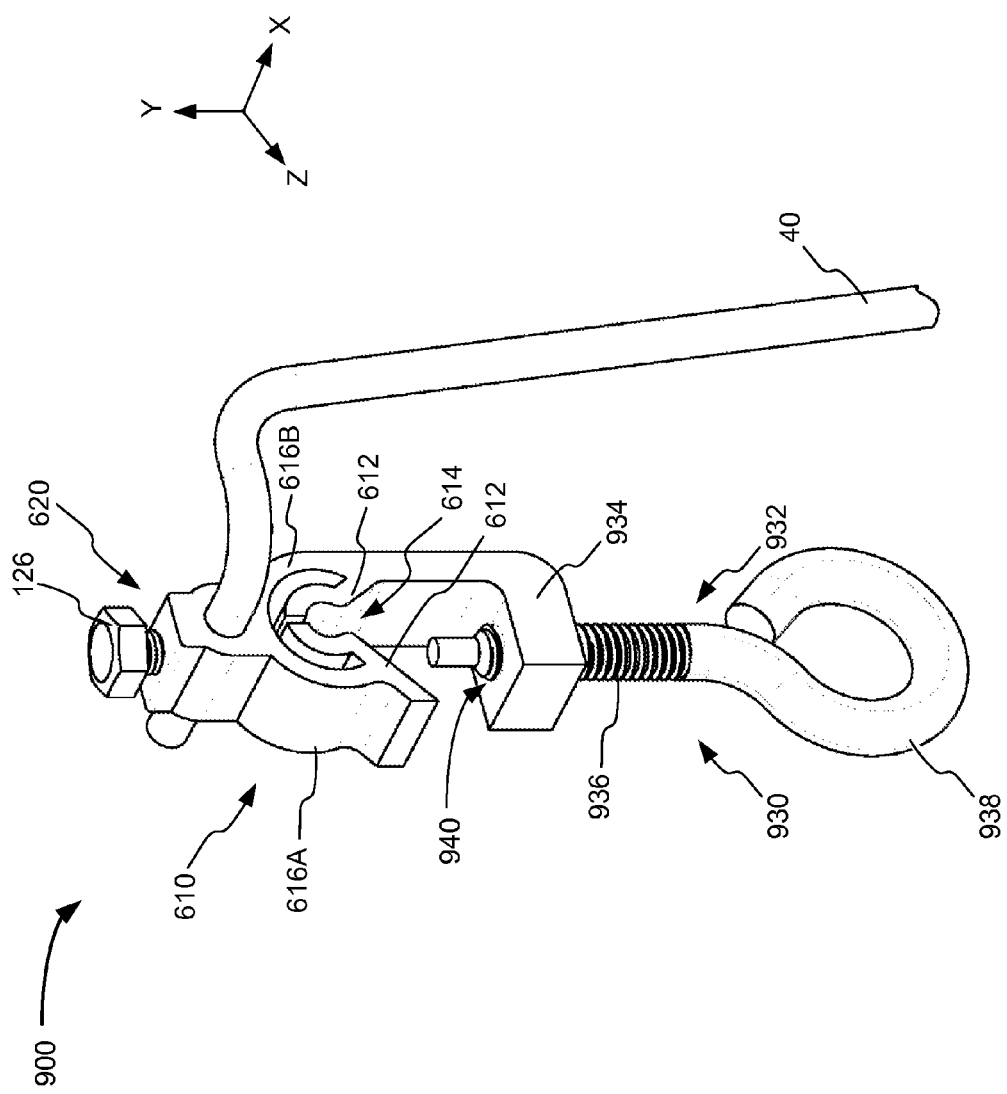
FIG. 10 provides an isometric view of the stirrup connector of FIG. 9.
Figure 11:
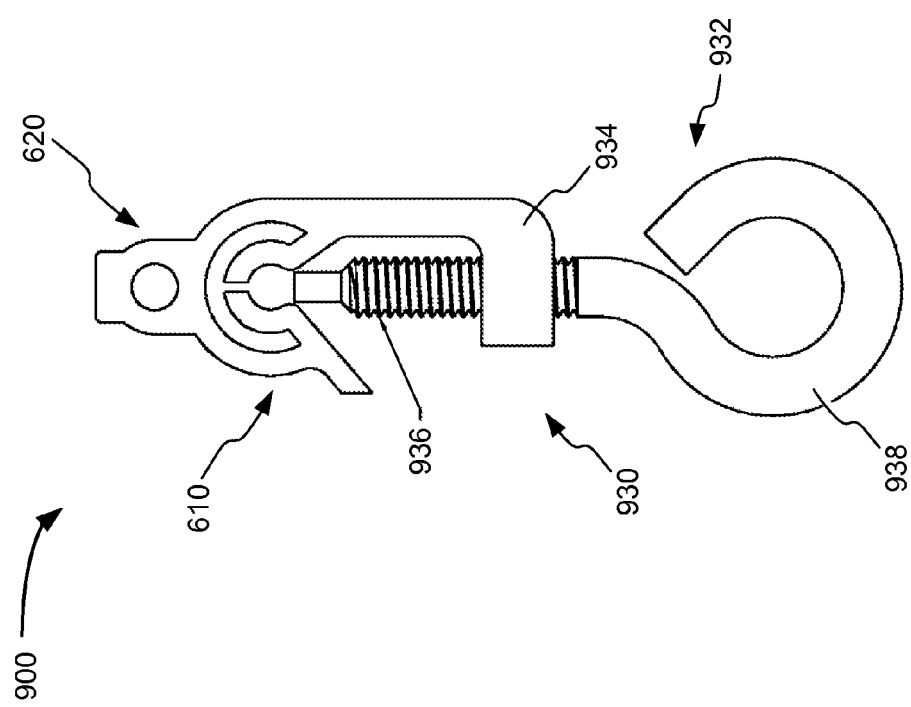
FIG. 11 provides a side view of the stirrup connector of FIG. 9.

FIG. 10 provides an isometric view of stirrup connector 900 with tap line 40 connected, and FIG. 11 provides a side view of stirrup connector 900. Referring collectively to FIGS. 9-11, stirrup connector 900 may include a clamp 610, a lug area 620, and control section 930. Clamp 610 and lug area 620 may include features described above in connections with, for example, FIGS. 6-8.

As shown in FIGS. 9-11, control section 930 may include an eyebolt 932 and a support brace 934. Eyebolt 932 may include a threaded portion 936 and a ring 938 configured to receive a hot stick. Support brace 934 may include a threaded bore 940 to receive the threaded portion 936 of eyebolt 932. Ring 938 may be sized to receive one or more standard hot stick attachments to enable stirrup connector 900 to be placed on stirrup 10. FIG. 10 shows eyebolt 932 in an open configuration so that clamp 610 can be installed over stirrup 10. FIGS. 9 and 11 show eyebolt 932 in a closed configuration so that an installed stirrup 10 (not shown in FIG. 11) can be retained within clamp 610.

In operation, prior to installation of stirrup connector 900, eyebolt 932 may be adjusted within threaded bore 940 to an open position. A hotstick may be inserted through ring 938 and used to lift stirrup connector 900 up to stirrup 10. Stirrup connector 900 may be positioned so that clamping area 614 is directly above stirrup 10. The hotstick (e.g., still inserted through ring 938) may then be pulled downward to force clamp 610 over stirrup 10. Jaws 612 of stirrup connector 900 may expand and contract to enable clamp 610 to snap onto stirrup 10 when stirrup connector 900 is pulled downward over stirrup 10.

Using the hotstick, eyebolt 932 may be screwed up within threaded bore 940 until eyebolt 932 is in a closed position (e.g., contacting stirrup 10). In one implementation, support brace 934 and threaded portion 936 may be configured such that eyebolt 932 cannot extend into clamping area 614 (e.g., to prevent eyebolt 932 from pushing stirrup 10 past clamping area 614. In the configuration of FIGS. 9-11, after clamp 610 is snapped onto stirrup 10, eyebolt 932 could optionally be removed or left in an open position to provide a storm-safe installation of stirrup connector 900. In another implementation, control section 930 may be included with a different clamp/lug design and location (e.g., clamp 110 and lug area 120).

Figure 12A:
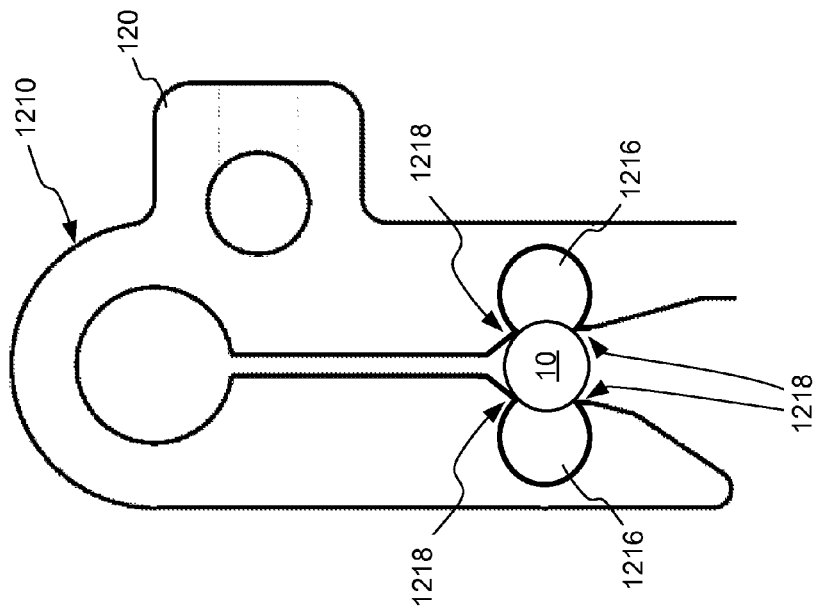
FIGS. 12A and 12B provide side views of a stirrup connector with a line-edge clamping area according to an implementation described herein.
Figure 12B:
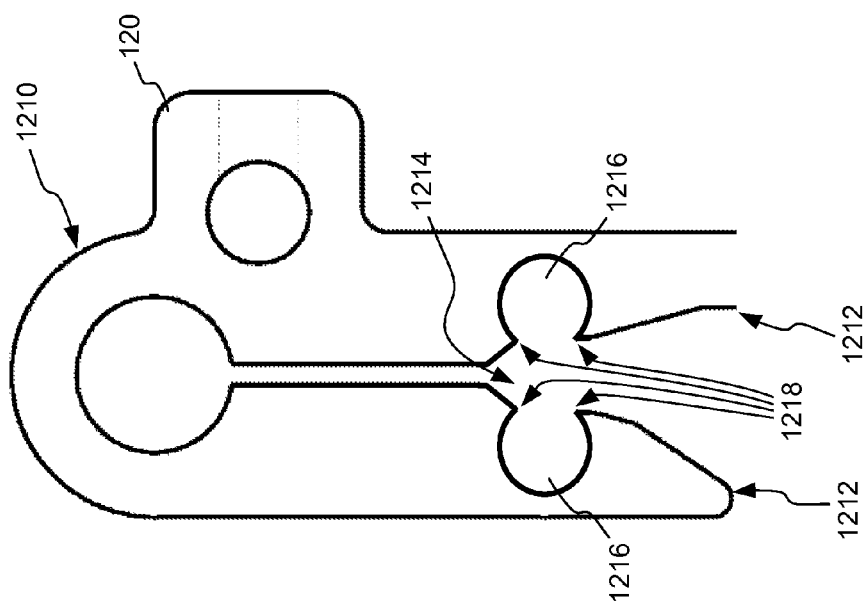

FIGS. 12A and 12B provide side views of a stirrup connector clamp 1210 with a line-edge clamping area according to an implementation described herein. More particularly, FIG. 12A provides a side view of stirrup connector clamp 1210 with a line-edge clamping area 1214, and FIG. 12B provides a side view of stirrup connector clamp 1210 with stirrup 10 engaged in clamping area 1214.

Referring collectively to FIGS. 12A and 12B, a set of jaws 1212 of clamp 1210 may include recesses 1216 adjacent to line-edge clamping area 1214. Recesses 1216 may form edges 1218 along an interior surface of jaws 1212. In operation, clamp 1210 may be secured to stirrup 10 in the same manner described above. Generally, clamp 1210 may be forced downward over stirrup 10 and snap onto stirrup 10. When stirrup 10 is secured within clamping area 1214, clamping area 1210 may engage stirrup 10 at line-edges 1218. The contact between stirrup 10 and line edges 1218 may provide, for example, a uniform contact that prevents arcing.

Stirrup connectors describe herein (e.g., stirrup connector 100/600/900) may be formed from an electrically conductive material, such as copper, brass, bronze, or aluminum. In one implementation, the stirrup connector may be formed as a single piece including, for example, a clamp (e.g., clamp 110/610), a lug area (e.g., lug area 120/620), and a control section (e.g., control section 130). In other implementations, the stirrup connector may include two or more separate components. The stirrup connector may be formed, for example, using an extrusion process, a molding process, casting process, etc.

According to implementations described herein, a stirrup connector may include a lug, a clamp, and a control section. The lug may be configured to secure a tap line to the stirrup connector. The clamp may secure the stirrup connector to a stirrup. The clamp may include a set of jaws forming an opening that is smaller than a diameter of the stirrup and may be configured to snap onto the stirrup when the set of jaws is forced against the stirrup at the opening. The control section may be configured to be releasably engaged with a hot stick and to translate a connecting force from the hotstick to the clamp to secure the clamp to the stirrup. The stirrup connector may provide an electrical connection between the stirrup and the tap line when the clamp is secured to the stirrup.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A stirrup connector, comprising:
   a cable connecting device configured to secure a tap line to the stirrup connector;
   a clamp to secure the stirrup connector to a stirrup, wherein the clamp includes a set of jaws forming an opening that is smaller than a diameter of the stirrup and wherein the clamp is configured to snap onto the stirrup when the set of jaws is forced against the stirrup at the opening; and
   a control section configured to be releasably engaged with a hot stick and to translate a downward connecting force from the hotstick to the clamp such that the downward force secures the clamp to the stirrup,
   wherein the stirrup connector is configured to provide an electrical connection between the stirrup and the tap line when the clamp is secured to the stirrup, and
   wherein the stirrup connector is configured to rotate so that a downward disconnecting force, applied by the tap line, releases the clamp from the stirrup.

2. The stirrup connector of claim 1, wherein the stirrup connector is configured to pivot about the stirrup in response to the downward disconnecting force.

3. The stirrup connector of claim 1, wherein the clamp includes a retention strength that is less than the downward disconnecting force, applied by the tap line, that would otherwise cause damage to a power line connected to the stirrup.

4. The stirrup connector of claim 3, wherein the downward disconnecting force causes the stirrup connector to pivot about the stirrup.

5. The stirrup connector of claim 1, wherein the cable connecting device, the clamp, and the control section are formed as a single piece.

6. The stirrup connector of claim 1, wherein the clamp includes a clamping area that is sized to receive a particular stirrup diameter.

7. The stirrup connector of claim 1, wherein the clamp includes a clamping area to receive the stirrup, and wherein the clamping area includes a plurality of line edges to secure the stirrup.

8. The stirrup connector of claim 1, wherein the control section includes an eyebolt and a threaded bore to receive the eyebolt.

9. The stirrup connector of claim 1, wherein the jaws are configured to flex at one location on the clamp to receive the stirrup.

10. The stirrup connector of claim 1, wherein the jaws are configured to flex at two or more locations on the clamp to receive the stirrup.

11. A system, comprising:
a stirrup configured to be secured to a power line; and
a stirrup connector configured to provide an electrical connection between the stirrup and a tap line, the stirrup connector including:
a lug to secure the tap line, and
a clamp to secure the stirrup connector to the stirrup, wherein the clamp includes a set of jaws, forming an opening, that flexes to receive and secure the stirrup within the clamp when the stirrup exerts a connecting force into the opening, wherein the clamp is configured to release the stirrup when the tap line exerts a disconnecting force that is at least equal to the connecting force, and wherein the stirrup connector is configured to rotate when the disconnecting force is applied by the tap line to release the clamp from the stirrup.

12. The system of claim 11, wherein stirrup connector further includes:
a control section configured to be releasably engaged with a hot stick and to translate force from the hotstick to the clamp.

13. The system of claim 12, wherein the control section further includes an eyebolt, the control section being configured to be advanced toward a clamping area to prevent release of the clamp from the stirrup.

14. The system of claim 11, wherein a disconnecting force applied by the tap line causes the stirrup connector to pivot about the stirrup.

15. The system of claim 11, wherein the lug and the clamp are formed as a single piece.

16. The system of claim 11, wherein the jaws are configured to flex at two or more discontinuous locations on the clamp.

17. The system of claim 11, wherein the jaws are configured to flex at one location on the clamp to receive the stirrup.

18. The system of claim 11, wherein the clamp includes a clamping area to receive the stirrup, and wherein the clamping area includes a plurality of line edges to engage the stirrup.

19. A stirrup connector, comprising:
a cable connecting device configured to secure a tap line to the stirrup connector;
a control section configured to be releasably engaged with a hot stick and to receive a connecting force from the hotstick; and
a clamp to secure the stirrup connector to a stirrup,
wherein the clamp includes an opening that flexes to receive the stirrup within the clamp when the connecting force pushes the stirrup into the opening,
wherein the clamp is configured to permit the stirrup connector to pivot about the stirrup when the stirrup is secured by the clamp, and
wherein, when the tap line exerts a disconnecting force, the stirrup connector to pivots about the stirrup to align the opening with the direction of the disconnecting force and the clamp flexes to release the stirrup out of the opening.

20. The stirrup connector of claim 19, wherein the clamp includes a clamping area to receive the stirrup, and wherein the clamping area includes a plurality of line edges to engage the stirrup.

* * * * *